(12) United States Patent
Nielsen et al.

(10) Patent No.: US 8,013,678 B2
(45) Date of Patent: Sep. 6, 2011

(54) HYBRID FEEDBACK CONTROLLED OSCILLATION MODULATOR AND SWITCHING POWER AMPLIFIER SYSTEM

(75) Inventors: Karsten Nielsen, Helsingör (DK); Petar Ljusev, Sønderborg (DK)

(73) Assignee: Bang & Olufsen Icepower A/S, Gl., Lyngby (DK)

( * ) Notice: Subject to any disclaimer, the term of this patent is extended or adjusted under 35 U.S.C. 154(b) by 297 days.

(21) Appl. No.: 12/224,542

(22) PCT Filed: Mar. 2, 2007

(86) PCT No.: PCT/IB2007/000493
§ 371 (c)(1),
(2), (4) Date: Aug. 29, 2008

(87) PCT Pub. No.: WO2007/099442
PCT Pub. Date: Sep. 7, 2007

(65) Prior Publication Data
US 2010/0277238 A1   Nov. 4, 2010

(30) Foreign Application Priority Data

Mar. 3, 2006 (SE) ........................... 0600494

(51) Int. Cl.
*H03F 3/217* (2006.01)
(52) U.S. Cl. .......................... 330/251; 330/10
(58) Field of Classification Search .............. 330/10, 330/251, 207 A
See application file for complete search history.

(56) References Cited

U.S. PATENT DOCUMENTS

| | | | |
|---|---|---|---|
| 4,458,208 A | 7/1984 | Abe | |
| 5,410,592 A | 4/1995 | Wagner et al. | |
| 6,118,336 A * | 9/2000 | Pullen et al. | 330/10 |
| 6,362,702 B1 | 3/2002 | Nielsen et al. | |
| 6,489,840 B2 | 12/2002 | Botti et al. | |
| 2004/0222845 A1 | 11/2004 | Yang et al. | |
| 2005/0068121 A1 | 3/2005 | Nielsen et al. | |
| 2007/0069814 A1 * | 3/2007 | Giotta et al. | 330/251 |

FOREIGN PATENT DOCUMENTS

| | | |
|---|---|---|
| EP | 1 376 858 | 1/2004 |
| JP | 56 039606 | 4/1981 |
| JP | 2005-123949 | 5/2005 |

OTHER PUBLICATIONS

Notification of Reason for Rejection for corresponding Japanese patent application No. 2008-556872 mailed May 9, 2011.

* cited by examiner

*Primary Examiner* — Hieu P Nguyen
(74) *Attorney, Agent, or Firm* — Harness, Dickey & Pierce, P.L.C.

(57) ABSTRACT

A Hybrid feedback Controlled Oscillation Modulator (HCOM) is disclosed, having a $1^{st}$ feedback path from the output voltage of the switching stage and a second feedback path from the filter output, the two feedback paths being superposed to provide a weighted state feedback signal. The state feedback path signal is subtracted from the input signal to form an error signal, the error signal filtered by a forward path compensation block B(s), closing the loop by feeding the pulse modulator, the loop having a transfer function such that self-oscillation can be established in the closed loop system. In an example embodiment, the first feedback path has a low pass characteristic and the second feedback path lead characteristic, the first feedback path being weighted by a weighting factor β. Further embodiments include a pure passive realization without a forward path device and the application of $3^{rd}$ feedback loops to enhance global amplifier performance.

16 Claims, 11 Drawing Sheets

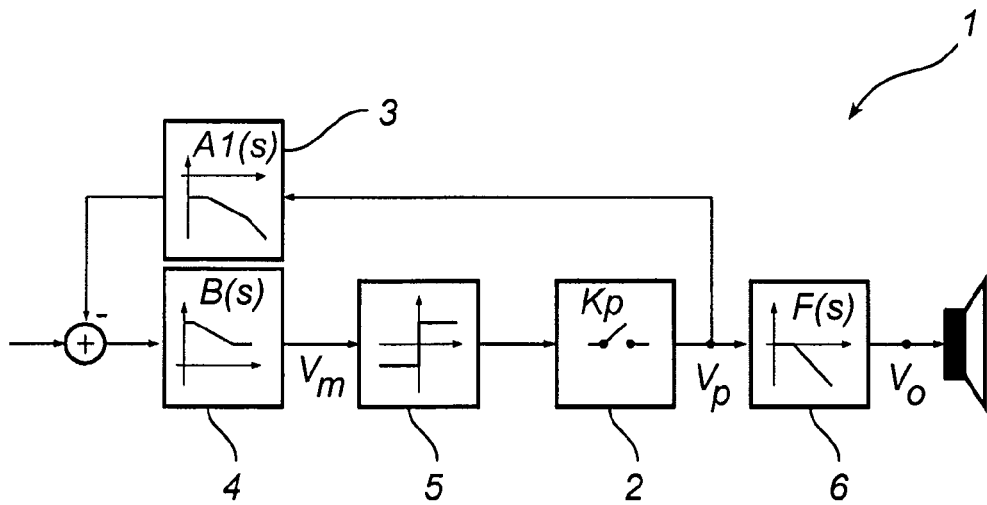
(Prior art) Fig. 1a
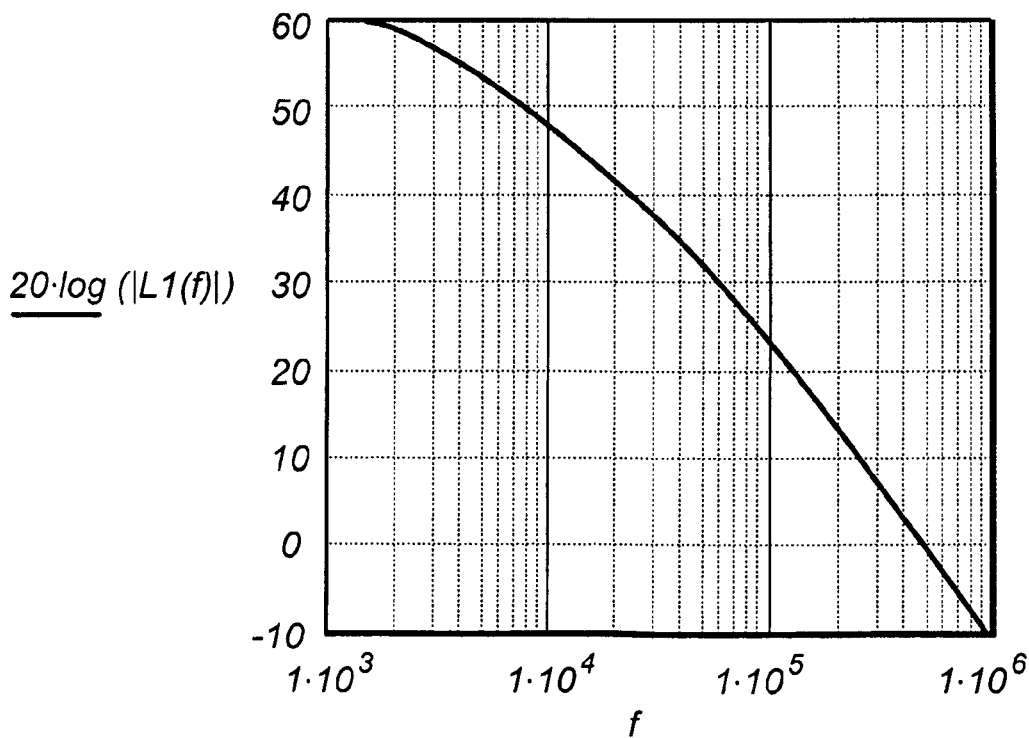
(Prior art) Fig. 1b

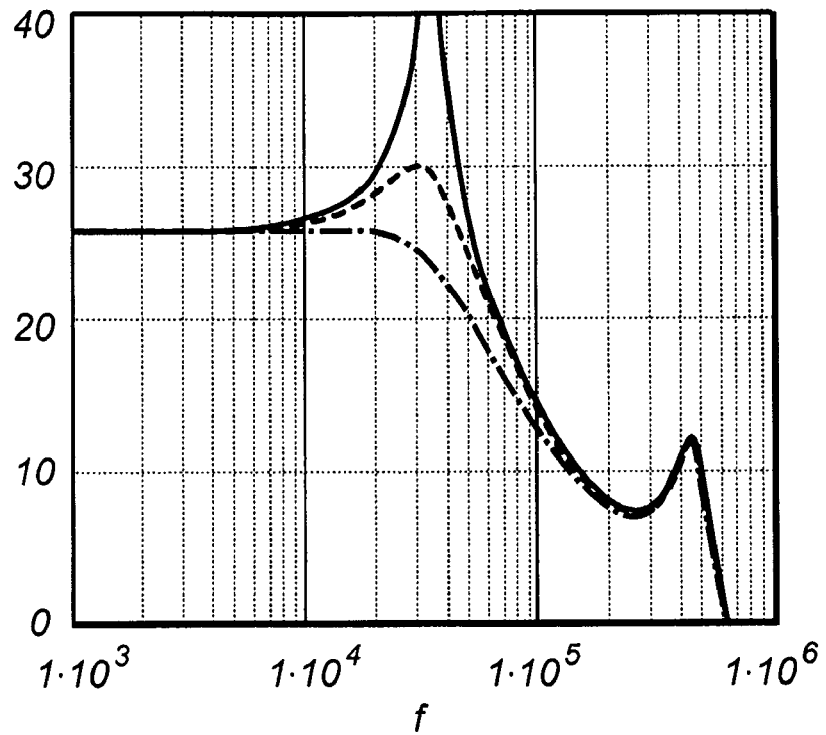
20·log (|H1(f)·F(f,inf)|)
20·log (|H1(f)·F(f,8ohm)|)
20·log (|H1(f)·F(f,4ohm)|)
*(Prior art) Fig. 1c*

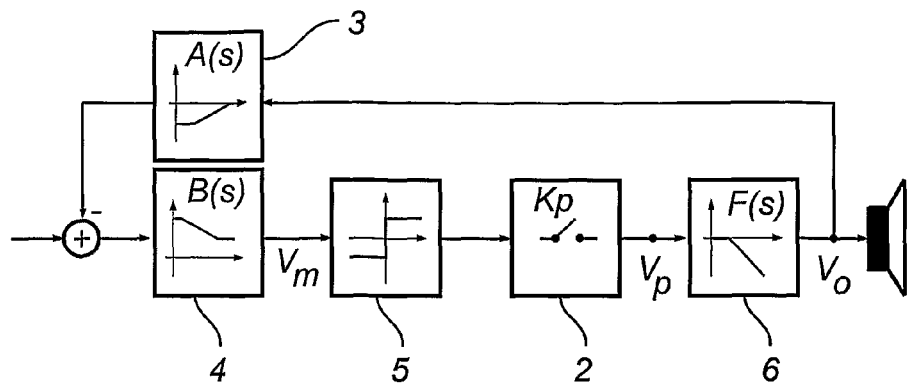
(Prior art) *Fig. 2a*
20·log (|L(f,inf)|)
———
20·log (|L(f,8ohm)|)
– – – – – –
20·log (|L(f,4ohm)|)
–·–·–·–
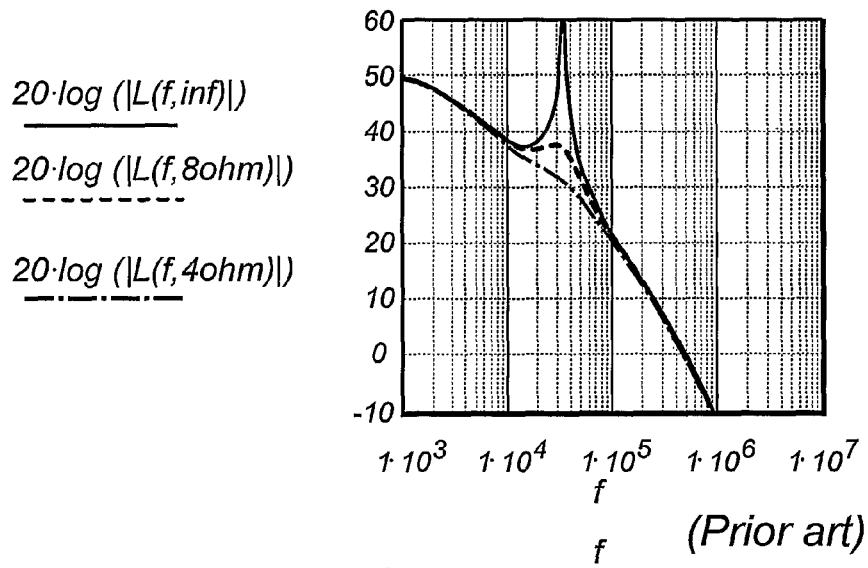
(Prior art) *Fig. 2b*
arg( L(f,inf))·$\frac{180}{\pi}$
———
arg( L(f,8ohm))·$\frac{180}{\pi}$
– – – – – –
arg( L(f,4ohm))·$\frac{180}{\pi}$
–·–·–·–
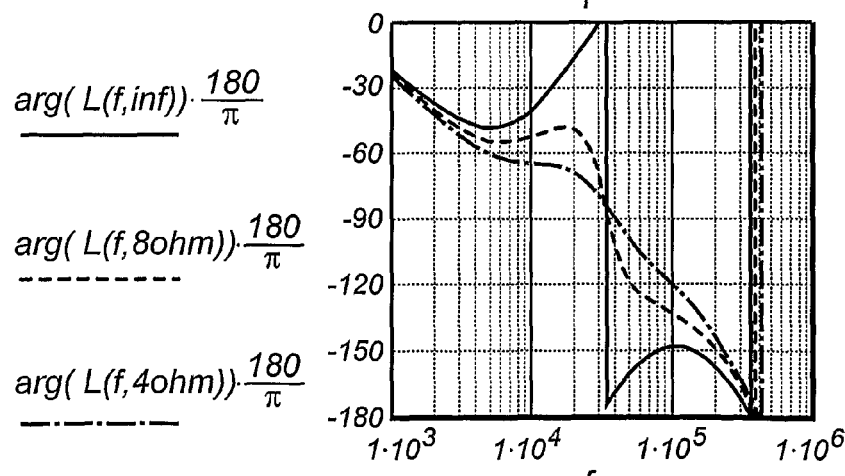
(Prior art) *Fig. 2c*

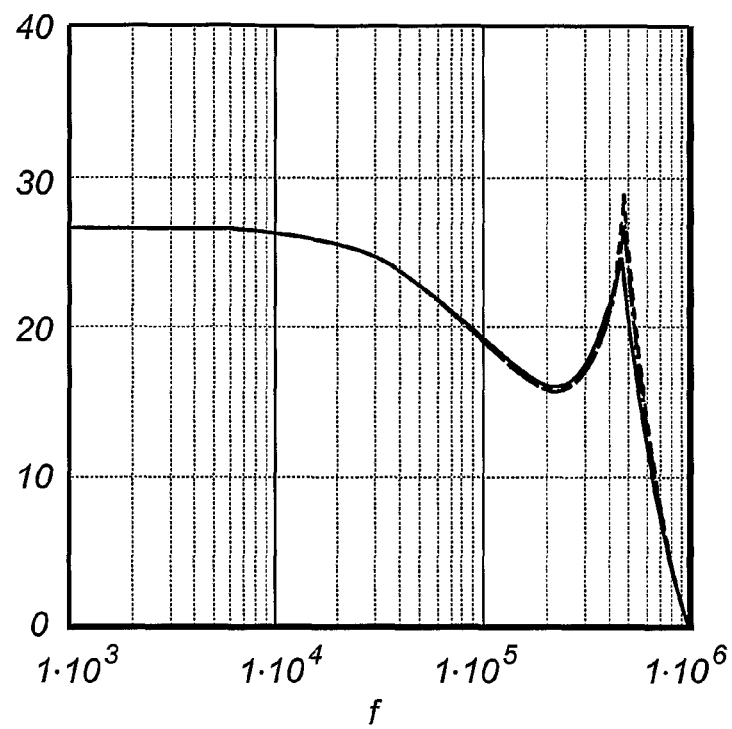
(Prior art) *Fig. 2d*

HYBRID FEEDBACK CONTROLLED OSCILLATION MODULATOR AND SWITCHING POWER AMPLIFIER SYSTEM

PRIORITY STATEMENT

This application is a National Phase entry of PCT Application No. PCT/IB2007/000493, filed on Mar. 2, 2007, which claims priority to Swedish Application No. SE 0600494-9 filed on Mar. 6, 2003.

FIELD OF THE INVENTION

This invention relates to the field of DC-DC and DC-AC power conversion, with particular relevance within high definition switching audio power amplification.

BACKGROUND OF THE INVENTION

Switching Class D audio amplifiers have found increasing use in the industry in recent years, due to the improvements in output stage switching devices and equally modulation and feedback control methods. The classical switching power amplifier system consists of the pulse modulator, converting an analog or digital source into a pulse modulated signal, following amplified by a switching power stage. A passive demodulation filter reproduces the power modulated power signal.

Most switching class D amplifiers are based on variants of Pulse Width Modulation. The challenges in switching amplifier design relate to:

PWM is in effect a multiplication/mixing between the input and power supply variable. This is equivalent to zero power supply rejection.

The switching power stage cause distortion from numerous contributions, since power MosFETs have parasitics and need to be driven by differentiated turn-off/turn-on delays.

The output filter is non-linear and contributes with significant addition of frequency dependent output impedance, which counters the desire for ideal voltage control of the speaker load.

EMI. The power stage, passive filter and the connecting cables (although filtered) source EMI. Perfect demodulation is not possible, leaving residuals on connected cables.

Achieving Robust Stability & Excellent audio performance is complicated, given the real world and test bench parameter space for load perturbations, input stimuli and power supply range.

In general, effective feedback control systems have proven vital to reach performance and robustness on par with legacy class AB amplifiers. Also, feedback control can be utilized to drive efficiency up and complexity down, as efficiency and complexity are determined by the power stage and demodulation filter.

Pulse modulation may be implemented with classical carrier based PWM or PDM modulation or by utilizing self-oscillation methods. The overall shortcomings of carrier based PWM switching power amplifiers have been extensively covered in the Ph.D thesis "Audio power amplifier techniques with energy efficient power conversion" by the inventor. In order to overcome classical PWM switching power amplifier drawbacks, a controlled oscillating modulator (COM), in effect a feedback oscillation modulator, was introduced in the international patent application WO98/19391. In combination with the an enhanced cascade feedback method, a range of the Class D shortcomings outlined above were solved.

Other oscillating modulator methods have been disclosed in prior art as WO2004/47286 by the applicant, WO 03/090343 and U.S. Pat. No. 6,489,841. These methods are characterized by self-oscillation being determined by feedback after the output filter, i.e. having the output filter as an integral, determining part on self-oscillation conditions. Such architectures will in the following be reference to as global loop oscillation modulators. The global loop oscillation modulator based switching amplifier systems disclosed in prior art have a particular advantage in terms of maximized loop gain-bandwidth enclosing the output filter, such that filter distortion and output impedance is minimized.

One serious problem however, by enclosing the filter inside the loop determining oscillation conditions, is that oscillation conditions become filter Q dependent. This generally introduces a load conditioned stability in the system, unless the filter is damped passively or the system compensated by other means. In particular load situations, open load or capacitive loads, corresponding to a full 180 deg phase lag at the filter natural frequency in case the filter is $2^{nd}$ order, will generally introduce a $2^{nd}$ oscillation state in the proximity of the filter natural frequency. Oscillation at the filter natural frequency, in a high filter Q load situation, is absolutely unacceptable, and will generally lead to system damage. Subsequently, passive filter damping with RC Zoebel networks to reduce filter Q in open load situations is a solution, however power resistors add complexity to the system and degrade efficiency. Excessive loop compensation by e.g. feedback path differentiation is an alternative attempted in prior art, however this reduces the effective loop transfer function gain. In effect, a $0^{th}$ order compensation system is needed around the filter in order to prevent the undesired $2^{nd}$ state oscillation around the filter natural frequency.

A second disadvantage of global loop oscillation modulators is that the feedback differentiation needed in order to improve stability, generally disturbs control system implementation. Feedback differentiators pick up noise and feed it to the control system typically consisting of linear opamps. A further disadvantage is the feedback differentiation, is the effect of introducing a pole or several poles in the system transfer function, thus limiting bandwidth. The feedback lead or differentiation puts put restrictions on amplifier design. As such it is impossible to design for both high performance, robustness to load perturbations and high efficiency over the complete audio band.

A third disadvantage of this prior art global loop oscillation modulator architecture is that power stage and power supply related errors are generally not corrected locally. The significant error sources introduced by the switching power stage and power supply need to pass the $2^{nd}$ or higher order output filter phase shift and delay, before generating the error signal for overall compensation. As such, the improved filter compensation generally compromises power stage and power supply related error compensation.

OBJECTIVES OF THE INVENTION

Accordingly, an object of the invention is to provide a new oscillating modulator, the Hybrid feedback Controlled Oscillation Modulator (HCOM), with particular relevance in switching Class D amplifiers, that provides enhanced wide bandwidth error compensation both local both power stage, power supply and local to filter related errors, with a simpler topological architecture that prior art.

Secondly, an objective of the invention, compared with the applicants own invention WO98/19391, is to provide an improved modulator and control system, that provides enhanced stability and unconditioned stable control of the output filter by active means, without the need for excessive feedback differentiation or passive RC filter damping. An objective of the invention is to eliminate the filter transfer function and thus the filter and load dependency from the system transfer function.

Third, an objective of the invention is to enable enhanced demodulation without the efficiency, stability and performance compromises of prior art, thus improving over all EMI.

SUMMARY OF THE INVENTION

These and other objects of the invention are achieved by a self-oscillating amplifier system, comprising a pulse modulator for modulating an input signal to form a pulse modulated signal, a switching power amplification stage for amplification of the pulse modulated signal, and a passive filter to demodulate the switching output signal. The system further comprises a first feedback path applied from the switching stage output, a second feedback path applied from the filter output, means for forming an error signal by subtracting signals from said two feedback paths from the input signal, and a forward path connecting said signal forming means to said pulse modulator, thereby forming a closed loop. The first and second feedback paths and said forward path having such transfer functions so as to ensure self-oscillating conditions of said closed loop.

The system is referred to as a Hybrid feedback Controlled Oscillating Modulator (HCOM) architecture.

In one preferred embodiment of the invention the $1^{st}$ feedback path has a low pass filter characteristic, and the 2nd feedback path from the amplifier output a phase lead characteristic, both feedback path weighted such that the local feedback path has a significantly higher attenuation that the global feedback path. In this preferred embodiment the forward path lag compensation filter is implemented to maximize effective loop transfer function gain within the target frequency band and provide well conditions modulation signal characteristics. This simple topology, new to the art, is realizable with only a single operational amplifier in combination with single ended output stages. This first embodiment of the invention offers a range of advantages new to the art, in terms of simplification, robust stability and increased overall performance.

The forward path can have a unity transfer function, or a constant gain, such that implementation is possible without operational amplifiers. However, the forward path can also comprise a compensation block with a more complex transfer function, if this is advantageous.

Further embodiments concern further performance improvement, by the addition of a $3^{rd}$ feedback loop feedback loop from amplifier output and feeding this to a $2^{nd}$ preamplifier stage, order to implement higher order control system and full flexibility in amplifier design, further increasing performance.

A further embodiment of the invention concerns the implementation of the HCOM output filter utilizing filter resonance and natural frequency optimization for both performance, efficiency improvement, and in particular improvement of overall demodulation and thereby EMI performance.

A further invention is particular in that adaptive feedback control is applied to general self-oscillation switching amplifier systems, whereby performance can be optimized based on the operation mode and load situation.

BRIEF DESCRIPTION OF THE DRAWINGS

The invention will be further described with reference to the drawings, in which:

FIG. 1 illustrates a prior art self-oscillation amplifier of the COM type, based on voltage feedback from the switching power stage.

FIG. 2 illustrates a prior art self-oscillation amplifier based on global loop oscillation, with the oscillator having the filter as an integral part.

DETAILED DESCRIPTION

Figure 3:
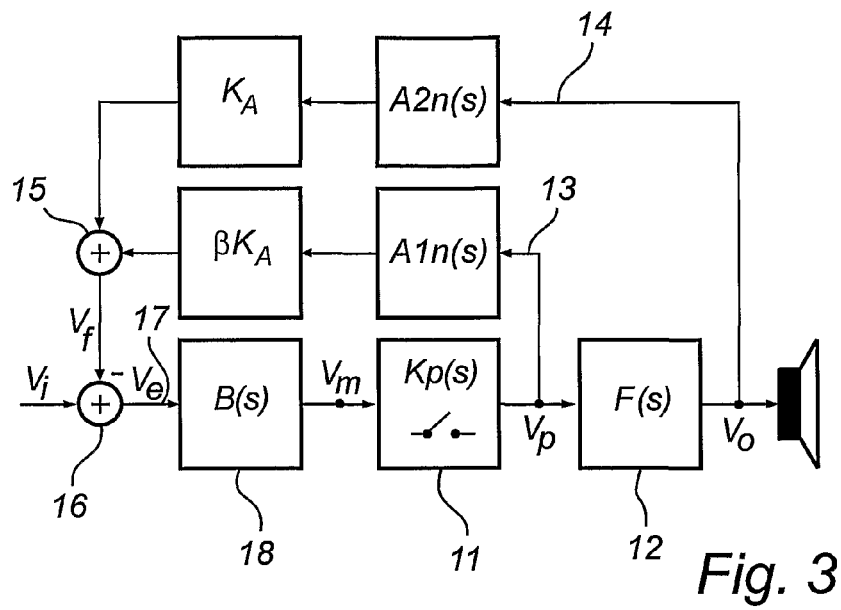
FIG. 3 illustrates a block diagram of a generic HCOM architecture according to the first embodiment of the invention.

A prior art self-oscillating switching amplifier 1 based on Controlled Oscillation Modulation (COM) is illustrated in FIG. 1, realized by a switching output stage 2, a voltage feedback path 3 with transfer function A(s), a forward path 4 having transfer function B(s), a non-hysteresis comparator 5 to enable pulse modulation, and providing a pulse modulated signal to the switching stage 2. The output of the switching stage is connected to a output passive filter 6 for demodulation. The loop transfer function L(s) and closed loop transfer functions are:

$$L(s) = B(s)Kp(s)A(s)$$

$$H(s) = \frac{B(s)Kp(s)}{1+A(s)B(s)K(s)}F(s)$$

Where Kp(s) is the averaged gain of pulse modulator and switching power stage, frequency dependent due to the inevitable propagation delay of the pulse modulator. In this prior art method, the oscillation is controlled by controlling the phase crossover frequency $f_o$.

$$\angle L(j\omega_o) = \angle (A(j\omega_o)B(j\omega_o)K(j\omega_o)) = 180$$

The overall reduction of forward path errors can be described by the Sensitivity function S(s) corresponding the error transfer function of all error and perturbations introduced in the forward path:

$$S(s) = \frac{1}{1+L(s)}$$

The following is defined to ease the analysis and comparison of control loop characteristics:

$$N_L = \frac{d(\ln(L))}{d(\ln(\omega))} \text{ Loop transfer function Slope}$$

$$S_M = \max_\omega |S|, \forall \omega \text{ within target frequency band.}$$

The advantages of the COM method of this type is well known and well described in WO98/19391 and WO 02/25357 by the inventor. An example realization with a first order loop compensator B(s) is illustrated in FIGS. 1b, 1c in terms of open loop and system transfer functions. In this illustrative case example fo=500 kHz and fn=35 kHz, and the remaining loop components are optimized to maximize loop gain bandwidth. Loop gain bandwidth is excellent, however one of the unsolved problems however is that the filter is not compensated in the basic modulator, and as such the overall system transfer function be strongly load dependent and output impedance high. Furthermore filter distortion contributions are not compensated. This can be approached by the enhanced MECC cascade feedback architecture in combination with the COM modulator, as described in WO98/19391, however at the price of a additional control circuitry.

It is desirable to suppress or even fully eliminate the filter Q dependency. A prior art method described in addressing this is illustrated in FIG. 2a, where the feedback path 2 with transfer function A(s) is instead based on an output from the demodulation filter 6 in order to include this element in the self-oscillating loop.

$$L(s) = B(s)K(s)A(s)F(s)$$

$$H(s) = \frac{B(s)K(s)F(s)}{1+A(s)B(s)K(s)F(s)}$$

By controlling the phase crossover frequency fo through the now 4 elements in the loop transfer function, oscillation is realized. An illustrative loop transfer function L(s), based on a $1^{st}$ order loop compensator B(s), is also illustrated in FIG. 2b (amplitude) and FIG. 2c (phase) vs load impedance.

The main limitation of this prior art approach is that the filter as strong influence on stability and oscillation characteristics and in this particular case example, the system is only stable, conditioned that the load is not capacitive or open. Any amplifier system should be robust to at least open load situation, since open load performance will be evaluated both in the test lab but also in the real world by e.g load steps, changing speakers etc.

From FIGS. 2b and 2c it is noted that the loop gain bandwidth is lower than for the COM architecture, and as such power stage related errors are less effectively suppressed for this prior art method. Besides the combination of lower error correcting loop gain bandwidth within the target frequency band, the fact that all power stage related error sources have to pass the filter with associated latency latency, before the error signal is generated, also reduces error suppression capability of this global oscillation modulator type.

It is desirable to have minimum passive damping in the output LC filter in order to maximize efficiency and reduce system cost. With minimum damping, the filter phase lag will approach 180 deg at the filter natural frequency $f_n$. With such under-damped filters, it is clear that the overall loop transfer function slope $N_L$ needs to be 0 or even positive, in order to prevent conditioned stability around the filter natural frequency $f_n$. This puts stringent limitations to the minimum achievable $S_M$ for this prior art method or the global loop oscillation type.

A second disadvantage of this prior art system is the influence of the feedback path differentiation on closed loop transfer function, as illustrated in FIG. 2d. Although the filter Q dependency on system transfer function is virtually eliminated, the needed feedback differentiation or wideband lead introduces a pole in the closed loop transfer function.

A further disadvantage is the feedback differentiation causing noise pickup and potentially distortion in the sensitive feedback path, this is feed to the summation point. Feedback noise is not suppressed, and the forward path processing blocks consisting of opamps and comparator are sensitivity to such high frequency noise, causing aliasing effects and introduces unwanted modulator distortion artifacts. It is desirable to keep feedback signals clean.

A third disadvantage is the limitations in oscillation frequency span, i.e. it is difficult to realize an oscillation frequency $f_o$ more than an order of magnitude beyond the filter natural frequency $f_n$ because of the combined lag of power stage and filter. It is desirable to reach beyond such a limitation and have full flexibility in amplifier parameter optimization.

In all, it is desirable to overcome the above limitations and restrictions with prior art, which is the primary objective of the present invention.

In the following the invention will be described and exemplified by certain preferred embodiments.

First Embodiment of the Invention

FIG. 3 illustrates the first preferred embodiment of the invention, the generic Hybrid Controlled Oscillation Modulator HCOM.

The central pulse modulator and switching power stage have been simplified to a system gain block 11, with transfer function Kp(s), consisting of the equivalent modulator and power stage averaged gain Kp and the total propagation delay of comparator, drive and power stage, tpd:

$$Kp(s) = Kp \cdot e^{-tpd \cdot s}$$

Note that the comparator may be of a non-hysteresis or hysteresis type in terms of e.g. a Schmitt trigger. The objectives of the invention are related to the state feedback architecture introduced in the following, and this can be applied on a range pulse modulator methods, as long as the resulting implementation can be expressed by an equivalent averaged gain and delay as defined above.

The pulse modulator, power stage and a filter 12, with transfer function F(s), is enclosed by state feedback architecture, consisting of a $1^{st}$ local feedback path 13 from the switching power stage voltage vp, in the future for reference called the local feedback path 13, with transfer function A1(s), and a $2^{nd}$ feedback path 14 from the filtered output vo, henceforth for reference called the global feedback path 14, with transfer function A2(s). Both feedback signals are processed by feedback blocks $A_1(s)$ and $A_2(s)$:

$$A_1(s) = \beta K_A A_1 n(s)$$

$$A_2(s) = K_A A_2 n(s)$$

Each feedback path 13, 14 consists of a normalized feedback transfer functions A1n(s) and A2n(s) having unity DC gain, and state feedback DC gain $K_{A1}$ and $K_{A2}$, with a weighting determined by a weighting factor β:

$$\frac{|A_1(0)|}{|A_2(0)|} = \beta$$

The two feedback signals are subsequently superposed in an adder 15 to form a common state feedback signal of. In this first preferred embodiment, this feedback signal is subtracted from the input in a subtractor 16 generating and error signal ve, which is feed through a forward path 17, optionally comprising a compensator block 18 with transfer function B(s). The resulting loop transfer L(s) is derived from FIG. 3:

$$L(s) = B(s)Kp(s)[A_1(s) + F(s)A_2(s)]$$

The closed loop system is forced into oscillation, by combining the delay of the pulse modulator and power stage, with one or several poles in the HCOM loop to implement a loop transfer function phase lag of 180 degrees at the desired switching frequency.

The HCOM system transfer function is generated from FIG. 3:

$$H(s) = \frac{K_P(s)B(s)F(s)}{1 + K_p(s)B(s)K_A[\beta A_{1n}(s) + A_{2n}(s)F(s)]}$$

The fundamental advantages of this first embodiment of the invention is that the oscillation control can in effect be primarily controlled by the $1^{st}$ feedback path, insensitive to filter Q. As such, stability is improved over global loop oscillation modulators of prior art. The insensitivity to filter Q and load relaxes the need for passive RC attenuation of the output filter, which improves efficiency, power bandwidth and lowers application cost.

A further advantage is that feedback differentiation is not necessarily needed as global loop compensation can be realized by the $1^{st}$ feedback path. A third advantage is that power stage and power supply induced errors are corrected locally and instantly, and as such the $1^{st}$ feedback path system in itself is a high performance amplifier. $2^{nd}$ feedback path will further improve performance, and provide the desired insensitivity to filter Q and flexible bandwidth control.

A further advantage is the large flexibility in system optimization, without restrictions between filter natural frequency and switching frequency.

Numerous alternative approach to loop synthesis can be devised by the engineer skilled in the art. In the following certain embodiments of the invention with particular advantages will be explained.

$2^{nd}$ Preferred Embodiment of the Invention

Figure 4:
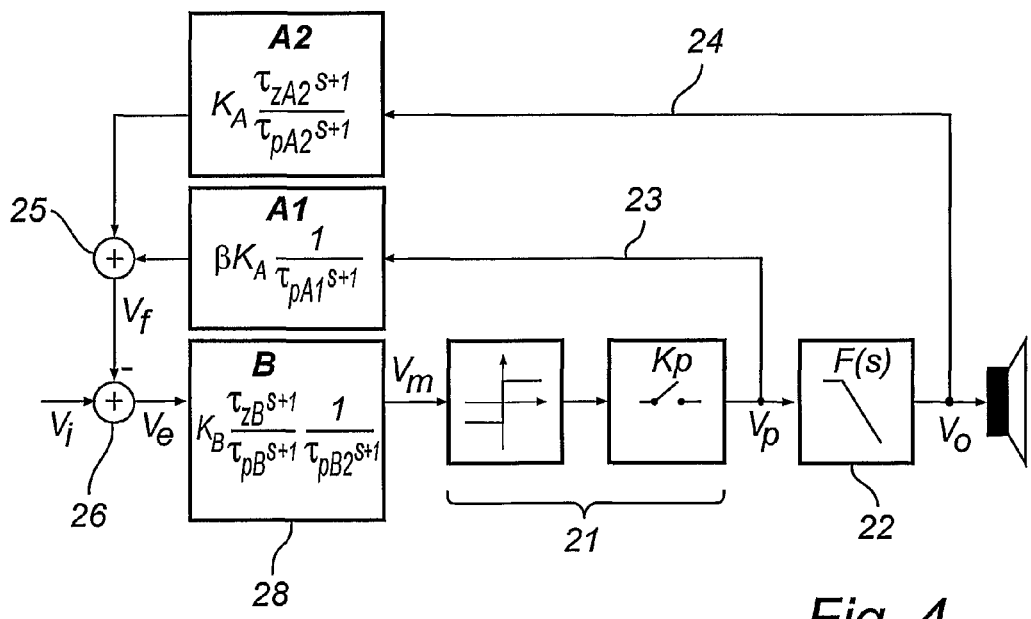
FIG. 4 illustrates a detailed block diagram of an preferred embodiment of the invention.

A particular example of HCOM realization is illustrated in FIG. 4. The $1^{st}$ feedback path 23 here has a low pass characteristic to provide demodulation and with the state feedback weighting factor β, determining the relative weighting of $1^{st}$ and $2^{nd}$ state feedback contribution:

$$A_1(s) = \beta K_A \frac{1}{\tau_{pA1} s + 1}$$

The $2^{nd}$ feedback path 24 from the filter output here has a feedback lead characteristic:

$$A_2(s) = K_A \frac{\tau_{zA2} s + 1}{\tau_{pA2} s + 1}$$

Feedback block A2(s) is configured as a lead compensator, at a specified center frequency $f_\alpha$ with amount of θ degrees, where the factor α is:

$$\alpha = \frac{1 + \sin\theta}{1 - \sin\theta}$$

The frequencies of the pole and the zero are connected with the center frequency $f_\alpha$ and the factor α in the following way:

$$f_{zA2} = \frac{1}{2\pi\tau_{zA2}} = f_\alpha \sqrt{\frac{1}{\alpha}}$$

$$f_{pA2} = \frac{1}{2\pi\tau_{pA2}} = f_\alpha \sqrt{\alpha}$$

The forward path 27, in this embodiment is realized as a lag compensator 28, with a $2^{nd}$ pole for enhanced control oscillation frequency characteristics:

$$B(s) = K_B \frac{\tau_{zB} s + 1}{\tau_{pB} s + 1} \frac{1}{\tau_{pB2} s + 1}$$

The B(s) compensation block is preferably implemented in a single opamp configuration, and the $2^{nd}$ pole may be implemented with this opamp configuration. Alternatively, B(s) may configured with only a single pole and zero. Various B(s) configurations will enable controlled oscillation by pole combinations and forward path delay or hysteresis.

In this preferred embodiment, the output filter is assumed standard $2^{nd}$ order LC filter, although the invention may be combined with higher order filter architectures as described later. A modest damping needs to be applied in order to control transient behavior in open load situations, i.e. filter resonance should follow the established guidelines, with special focus on the operating regimes where the control loop is saturated and cannot control the output filter by the virtue of the control system. The main issue in this situation is to prevent resonant over voltage on output capacitors. The overall transfer function of the output filter and load with the Zoebel network is:

$$F(s) = \frac{\frac{1}{sC_f + \frac{sC_z}{1+sR_zC_z} + \frac{1}{R}}}{sL_f + \frac{1}{sC_f + \frac{sC_z}{1+sR_zC_z} + \frac{1}{R}}}$$

The filter natural frequency and Q (without Zoebel network) is:

$$\omega_n = \frac{1}{\sqrt{LC}} \text{ and } Q_n = RC\omega_n = \frac{R}{L\omega_n}$$

Assuming that all poles and zero frequencies are outside the target frequency band, in order to have a constant in band system gain, we can approximate the HCOM system transfer function:

$$H(s) \approx \frac{1}{K_A(1+\beta)},$$

within the target frequency band

In the case where, the feedback path weighting is equal, $\beta=1$, we have:

$$H(s) \approx \frac{1}{2K_A},$$

within the target frequency band

The effective loop transfer function for the $2^{nd}$ feedback loop within the target frequency band can be approximated by:

$$L_2(s) = H_1(s)F(s)A_2(s)$$
$$= \frac{B(s)Kp(s)}{1+B(s)Kp(s)A_1(s)}F(s)A_2(s) \approx \frac{A_2(s)}{A_1(s)}F(s)$$

It is clear that $\beta=1$ causes the effective in band unity gain to be unity, i.e.

$$|S_2(s)| = \left|\frac{1}{\frac{A_2(s)}{A_1(s)}F(s)+1}\right| \approx \frac{1}{2},$$

within the target frequency band.

It is desirable to have more effective loop gain within the target frequency band, and this can effectively be controlled by the weighting factor. In preferred case, where $\beta \ll 1$, the following approximate relations hold:

$$H(s) \approx \frac{1}{A_2(s)} \approx \frac{1}{K_A},$$

within the target frequency band $$|S_2(s)| \approx \beta$$

As such, system transfer function gain is exclusively controlled by the $2^{nd}$ feedback path according to classical feedback theory, and the error correcting and frequency response stabilizing $2^{nd}$ feedback path loop gain contribution is unity and controlled by the stage feedback weighting factor $\beta$.

It is furthermore clear, that the transfer function F(s) of the filter 22 is present in both the numerator and the denominator of the system transfer function, hence the output filter behavior with varying loads will be very well controlled. A resonant high Q filter characteristic will enhance the effective suppression of filter Q sensitivity, as the filter Q increases.

$$|S_2(j\omega_f)| = \left|\frac{1}{\frac{1}{\beta}F(j\omega_f)+1}\right| \approx \left|\frac{\beta}{F(j\omega_f)}\right|$$

In this preferred embodiment, where $\beta \ll 1$, the filter transfer function is effectively cancelled from the system transfer function.

A particularly advantageous filter implementation related to the invention is that the filter 22 is realized in close proximity to the target frequency band, and exhibiting a resonant nature, by:

$$f_b < \omega_f < 2f_b, Q_{f,nom} \geq 1$$

This particular filter realization counter conventional filter design by proving improved compensation from the 2nd feedback path since the filter is in effect utilized as 2nd order resonant loop shaping function in the $2^{nd}$ loop transfer function L2(s). Further advantages of this particular filter realization is the increased demodulation, improving overall EMI characteristics. Finally this particular filter characteristic, integrated in the HCOM architecture, will provide maximized high frequency power, in effect allowing over modulation index exceeding 100% at the target frequency band limit $f_b$.

The above described embodiments of the invention may be realized with both single ended and BTL output stage topologies. A particularly advantageous implementation is with single ended output stage, where the HCOM state feedback path can be implemented by simple passive R, C means, without any active components.

As a practical example implementation of the $2^{nd}$ preferred embodiment of the invention is given by the parameter values in the table below. All frequencies are normalized to the target frequency bandwidth fb, in this example fb=20 kHz.

TABLE 1

| Parameter | Value | Comment |
|---|---|---|
| fb | 20 kHz | Maximal frequency in the target band |
| k | 26 dB | Target System gain |
| β | 0.1 | HCOM state feedback weightning factor controls $2^{nd}$ feedback loop gain within the target frequency band and furthermore controls $2^{nd}$ loop bandwidth. |

TABLE 1-continued

| Parameter | Value | Comment |
|---|---|---|
| Qn | 1.1 | Resonant filter design to enhance S2(s) |
| fn | 30 kHz | Filter natural frequency set very low, in order to meeting HF requirements. |
| Cz | 100 nF | Zoebel Capacitor. Minimal loss, high open load Q |
| Rz | 10 ohm | Zoebel Resistor. Minimal loss, high open load Q |
| fo | 600 kHz | More than 50 dB rejection of the fundamental. |
| tpd | 200 ns | Total system propagation delay |
| α | 3 | Lead factor. Small to prevent feedback noise pick-up/differentiation effect. |
| fα | 4 fb | Nominal lead factor center frequency |
| fpA1 | 5 fb | Control global loop bandwidth + provide dominating oscillation pole |
| fpB2 | NA | Non needed, oscillation phase provide by system propagation delay. |
| fpB | 1/10 fb | Maximize S(s) in the target frequency band. |
| fzB | 3 fb | High Loop gain bandwidth design. |

It should be noted that these parameter settings are only illustrative, and that the engineer skilled in the basic art of control systems design can devise alternative parameter combinations, dependent upon the target specifications in a given application.

Figure 5:
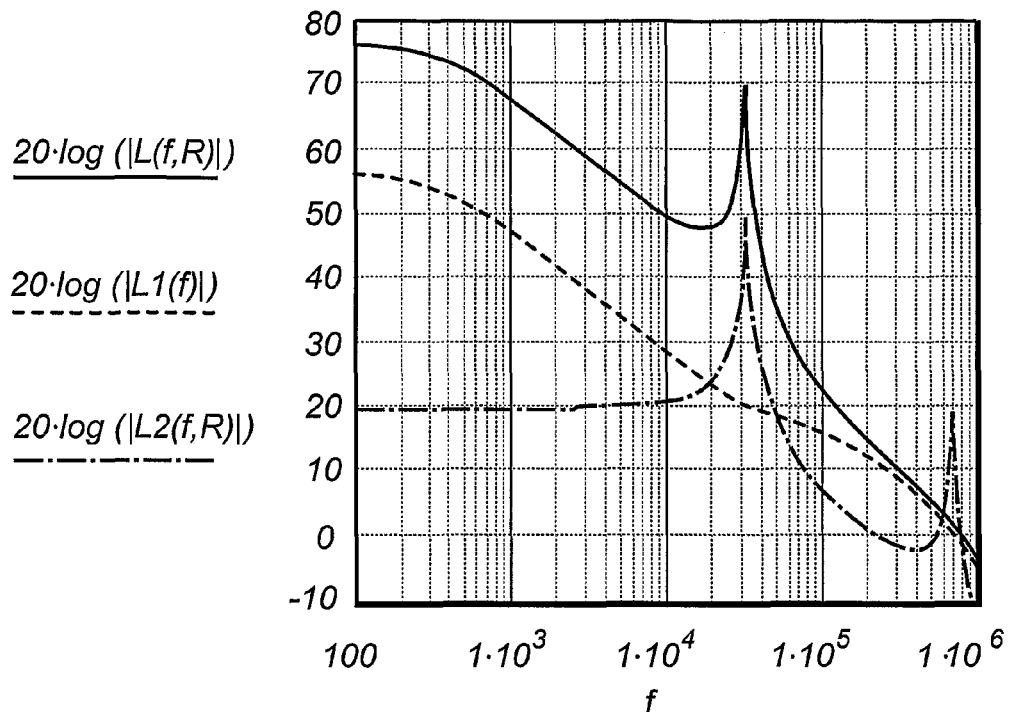
FIG. 5 illustrates loop transfer functions L1(s), L2(s), L(s) for an example HCOM realization with $\beta=0.1$, in the open load case.
Figure 6:
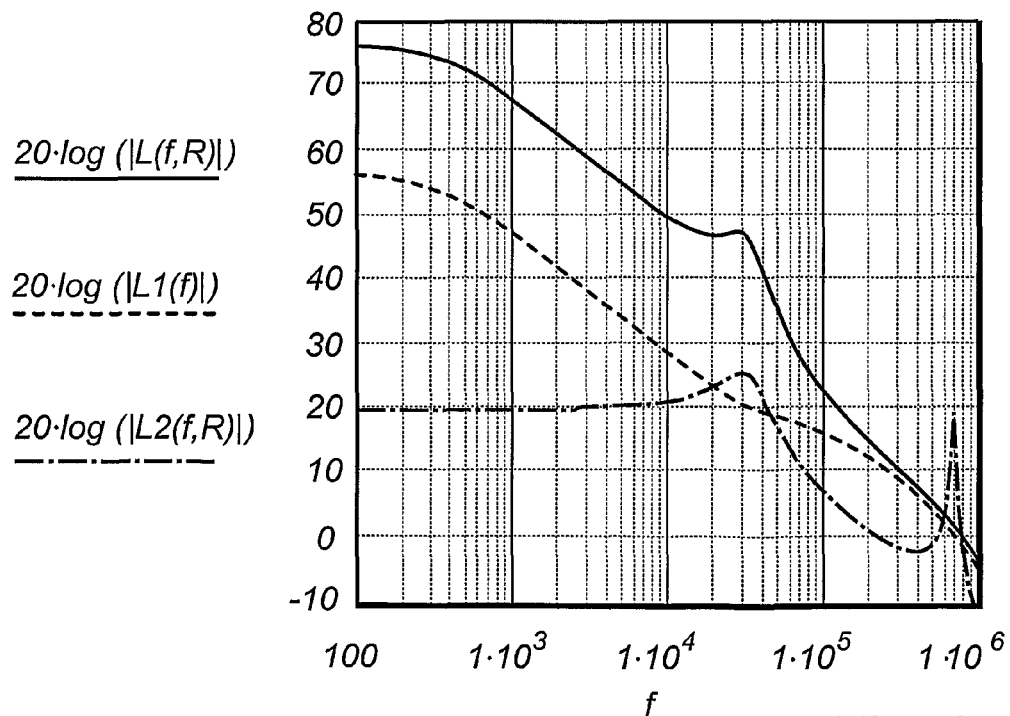
FIG. 6 illustrates loop transfer functions L1(s), L2(s), L(s) for an example HCOM realization $\beta=0.1$, in the nominal load case.

FIG. 5 and FIG. 6 illustrates the effective loop transfer functions L1(s), L2(s) and effective loop transfer function L(s) in both open load and nominal load conditions. In this particular example, we have an effective loop transfer function gain approaching 50 dB at 20 kHz, and in particular the resonant filter contributions is obvious in the high frequency range. The Bandwidth of the $2^{nd}$ feedback loop is approximately ⅓ of the $1^{st}$ feedback loop, securing oscillation control from the $1^{st}$ (local) feedback loop).

Figure 7:
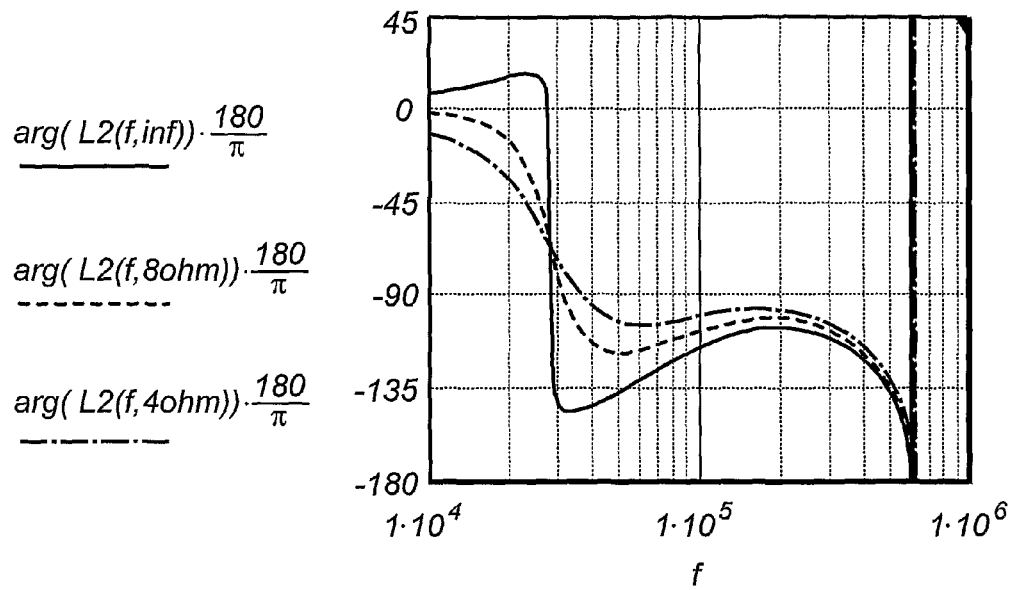
FIG. 7 illustrates the resulting phase of L2(s) for an example realization with $\beta=0.1$, with loads 4 ohm, 8 ohm and open load.

It is furthermore interesting to note, that L2(s) exhibits $0^{th}$ order characteristics below the filter natural frequency, and overall stays inherently stable with acceptable phase margins. This is seen from FIG. 7, where the L2(s) phase vs load is illustrated. Despite the highly under damped filter in open load/capacitive load situations, this preferred HCOM case example has decent stability margin, much improved over the prior art global loop oscillating modulator analysed in above (FIG. 2) under similar circumstances.

Figure 8:
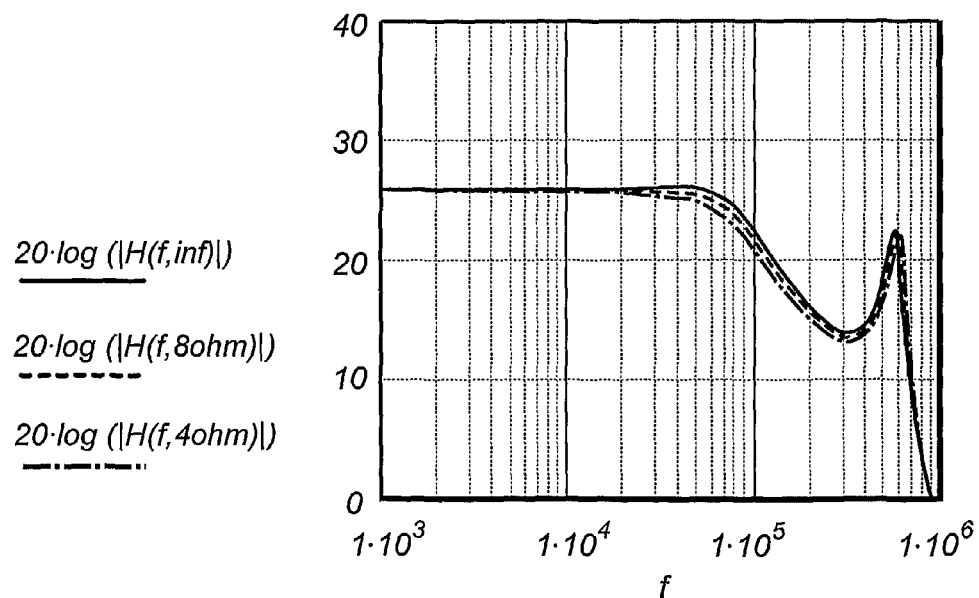
FIG. 8 illustrates the resulting system transfer function H(s) for an example realization with $\beta=0.1$, with loads 4 ohm, 8 ohm and open load.

FIG. 8 illustrates the HCOM system transfer function H(s) vs. frequency for this particular example parameter set. Clearly, the filter Q dependency is completely eliminated from the system transfer function. Furthermore, system bandwidth is well extended over the filter natural frequency, and well extended over what can be achieve by global loop oscillation modulators (FIG. 2), in this case a 100 kHz-3 dB bandwidth is realized in all loads, despite the under damped filter at fn=30 kHz. The reason is that no aggressive global loop feedback lead or differentiation is needed, and as such HCOM in general overcomes this obstacle of prior art.

It should be emphasized, that the given design approach is mainly illustrative, and that there are numerous possible variations of the $1^{st}$ and $2^{nd}$ embodiments of the invention described and exemplified above, in terms of optimizing the parameter sets (β, α, fα, fpA1, fzB, fpB).

A particularly simple variant is possible by e.g. eliminating the $2^{nd}$ feedback lead factor, A2(s)=KA. An alternative simplification concerns removal of the $1^{st}$ A1(s) Feedback pole, A1(s)=βKA. Both alternative are illustrative examples of this $2^{nd}$ preferred embodiment of the invention.

A $3^{rd}$ Preferred Embodiment of the Invention

Figure 9:
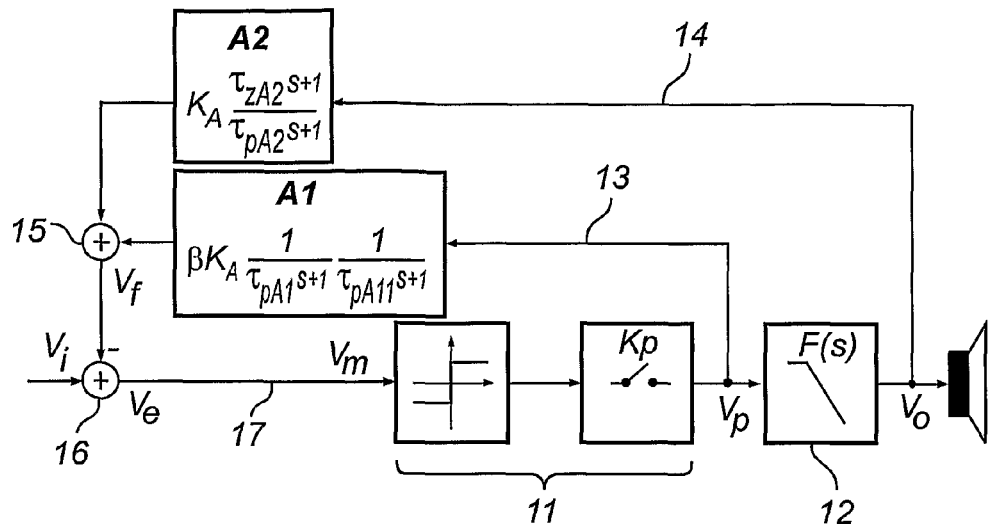
FIG. 9 illustrates a block diagram of 3rd advantageous embodiment of the invention.

A further preferred embodiment of the invention is particular in that it offers further simplification, having a forward path 17 with unity transfer function. The possible realization is illustrated in FIG. 9. In order to enable stable oscillation determined by the $1^{st}$ feedback path, A1(s) is here preferably of $2^{nd}$ order:

$$A_1(s) = \beta K_A \frac{1}{\tau_{pA1}s + 1} \frac{1}{\tau_{pA11}s + 1}$$

An example parameter set for this particularly simple embodiment of the invention is given below:

TABLE 2

| Parameter | Value | Comment |
|---|---|---|
| fb | 20 kHz | Maximal frequency in the target band |
| k | 26 dB | Target System gain |
| β | 0.1 | HCOM state feedback weightning factor controls $2^{nd}$ feedback loop gain within the target frequency band and furthermore controls $2^{nd}$ loop bandwidth. |
| Qn | 1.1 | Resonant filter design to enhance S2(s) |
| fn | 30 kHz | Filter natural frequency set very low, in order to meeting HF requirements. |
| Cz | 100 nF | Zoebel Capacitor. Minimal loss, high open load Q |
| Rz | 100 hm | Zoebel Resistor. Minimal loss, high open load Q |
| fo | 600 kHz | More than 50 dB rejection of the fundamental. |
| tpd | 200 ns | Total system propagation delay |
| α | 2 | Lead factor. Small to prevent feedback noise pick-up/differentiation effect. |
| fα | 3 fb | Nominal lead factor center frequency |
| fpA1 | 5 fb | Control global loop bandwidth + provide dominating oscillation pole |
| fpA11 | fo | $2^{nd}$ Oscillation controlling pole. |

Figure 10:
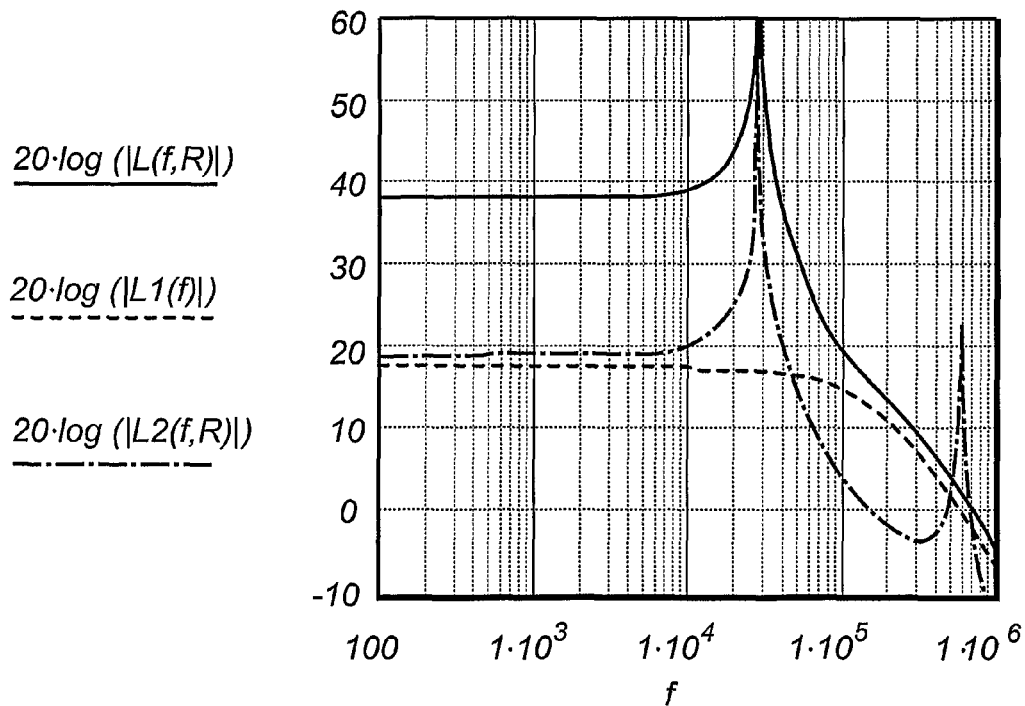
FIG. 10 illustrates loop transfer functions L1(s), L2(s), L(s) for and illustrate example of the 3rd embodiment of the invention with open load.
Figure 11:
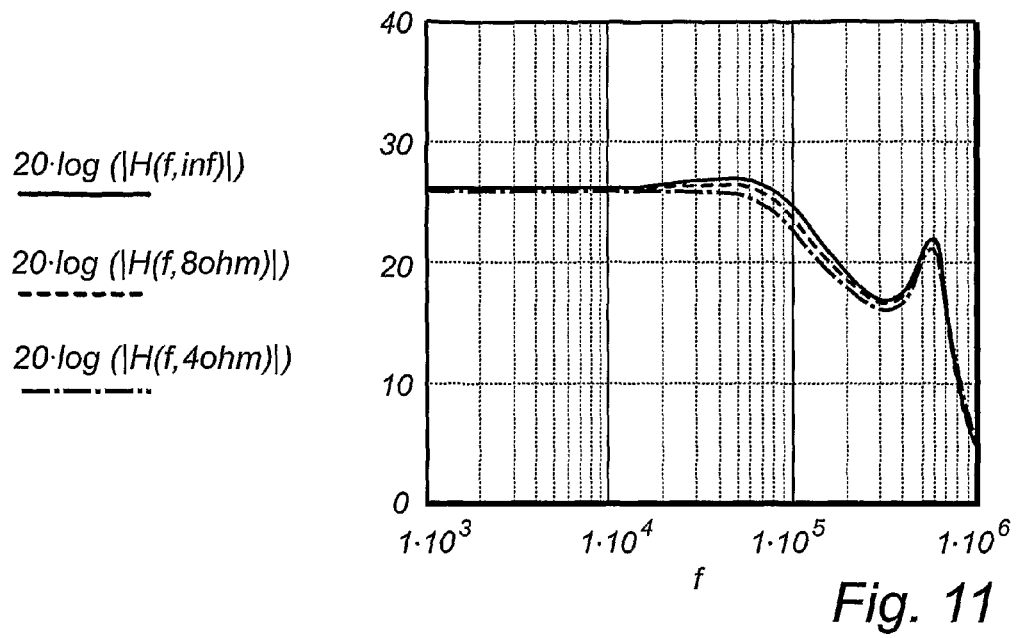
FIG. 11 illustrates the resulting system transfer function H(s) for an example realization of the 3rd embodiment of the invention.
Figure 12:
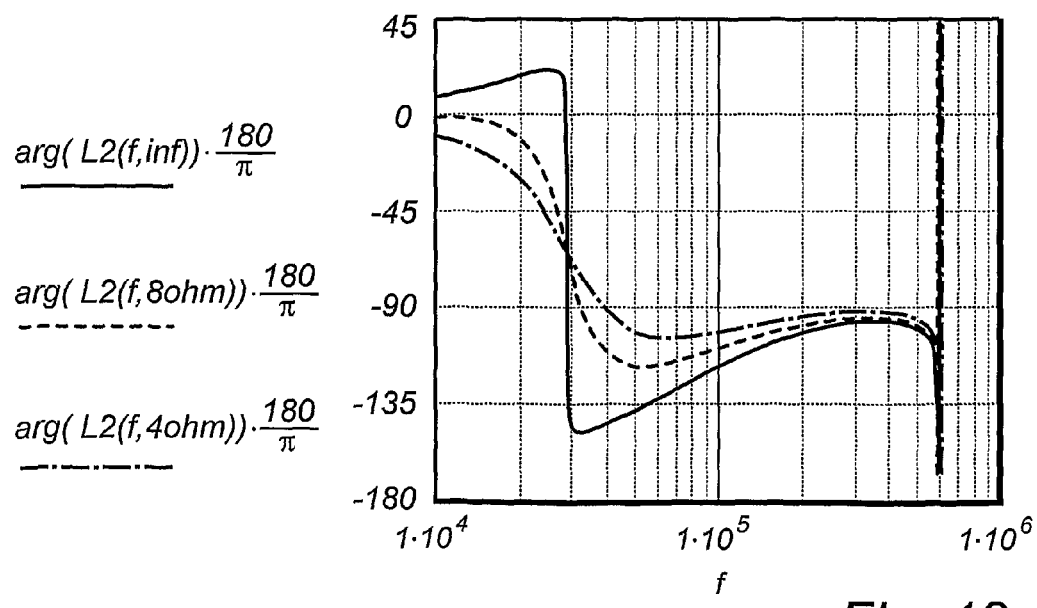
FIG. 12 illustrates the resulting phase of L2(s) for an example realization or the 3rd embodiment of the invention with loads 4 ohm, 8 ohm and open load.

FIG. 10 illustrates the resulting loop transfer functions L1(s), L2(s) and the effective loop transfer function L(s) for the resulting HCOM system of this $3^{rd}$ embodiment. The resulting loop transfer functions are now both $0^{th}$ order within the target frequency band and the effective error correction will thus be reduced. Overall stability and frequency response is excellent, as illustrated by FIGS. 11 and 12.

In single ended output stage realizations this third preferred embodiment may realized without any operational amplifiers. The HCOM system thus only requires passives and a comparator to enable either non-hysteresis or alternatively hysteresis based oscillation. When considering silicon integration, this is very attractive, and in many applications the resulting L(s) characteristics will be sufficient to compensate for the errors introduced by power stage, power supply and output filter. The simplistic HCOM architecture, representing the $3^{rd}$ embodiment of the invention, still is in effect invariant to load perturbations and equally important filter introduced distortion, as illustrated in FIG. 11, showing frequency response vs. load (4,8, open load).

It should be emphasized, that the given design approach is mainly illustrative, and that there are numerous possible variations of this $3^{rd}$ embodiments of the invention described and exemplified above, in terms of optimizing the parameter sets (β, α, fα, fpA1, fpA2).

A $4^{th}$ Preferred Embodiment of the Invention

A fourth embodiment of the invention includes the addition of one or a cascade of feedback loops 31 implemented from the filter output. This is relevant when the highest performance is desired, i.e by having in proved further improved control of the output filter.

Figure 13:
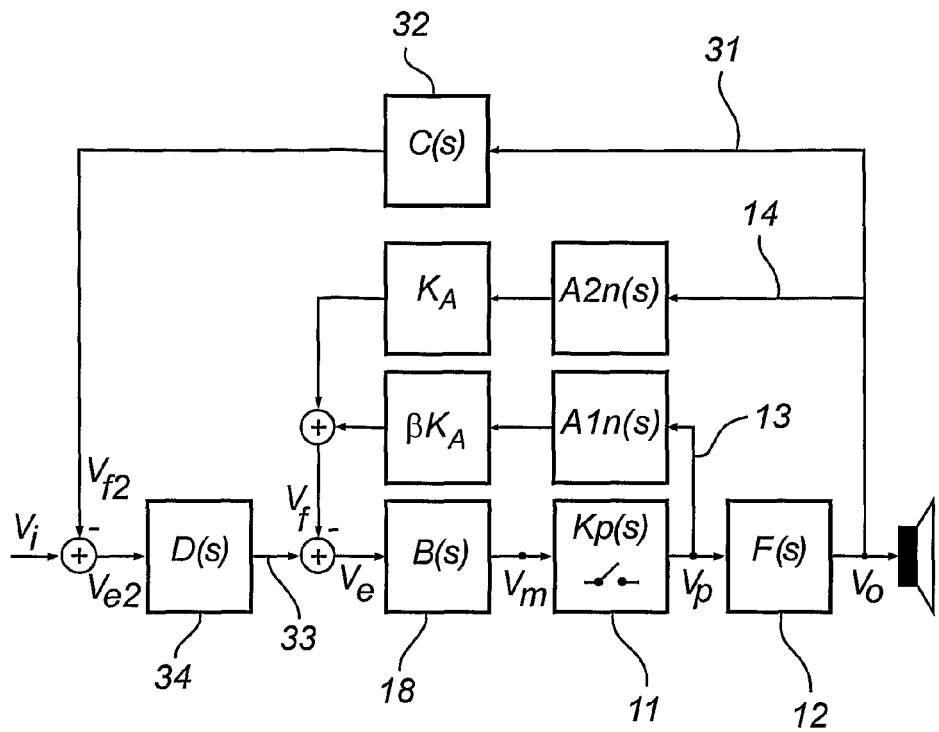
FIG. 13 illustrates a block diagram of a fourth embodiment of the invention with a 3rd feedback loop from the filter output.
Figure 14:
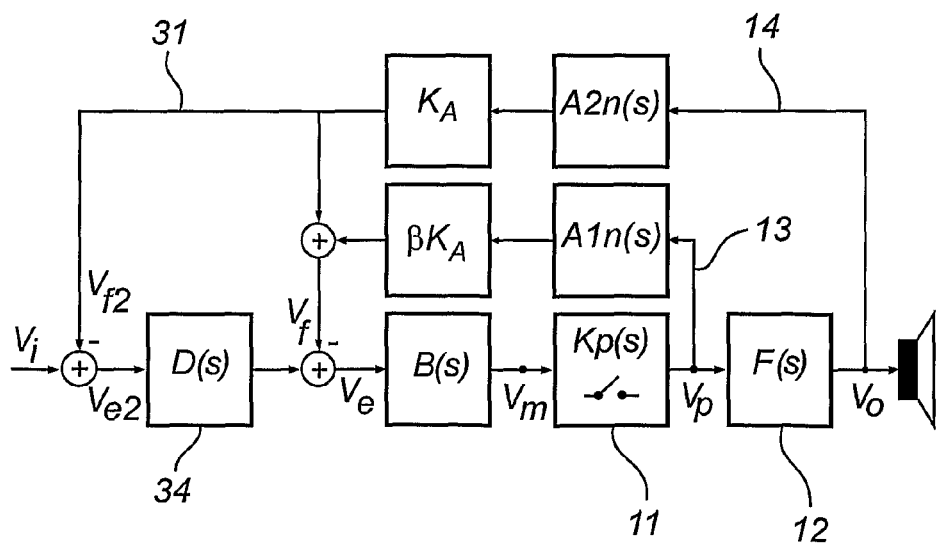
FIG. 14 illustrates a block diagram of a fourth embodiment in a simplified version.

This HCOM embodiment is illustrated in FIG. 13, where a separate feedback path 31, optionally with a feedback block 32 with transfer function C(s), and forward path 33 including a loop filter 34 with transfer function D(s). Feedback transfer function C(s) can preferably be realized as a constant attenuation determining overall system gain, and loop filter transfer function D(s) can preferably be implemented as a lag compensator controlling overall global loop characteristics. For simplification, an alternative realization is illustrated in FIG. 14, where $2^{nd}$ feedback path is realized as a cascade structure.

Figure 15:
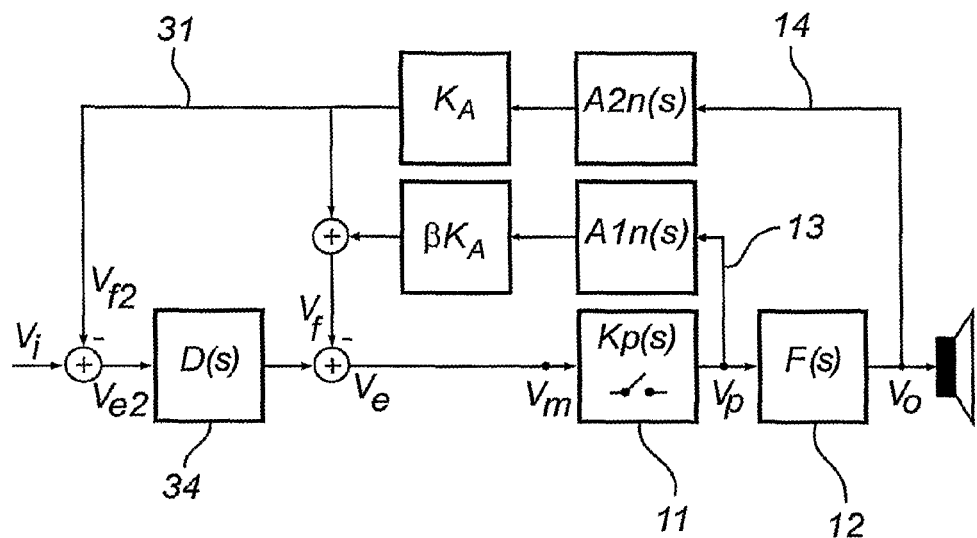
FIG. 15 illustrates a block diagram of a fourth embodiment in a further simplified version.

A further simplified variant of this $4^{th}$ embodiment of the invention is illustrated in FIG. 15, where an global loop enhanced cascade is implemented in on the simplistic purely passive HCOM architecture described above as the $3^{14}$ embodiment of the invention.

Combinations are obvious for the engineer skilled in the art, the herein described examples for enhancement of the basic HCOM architecture are mainly illustrative.

An Invention Related to General Switching Amplifiers

An invention is disclosed related to general self-oscillation amplifiers. Amplifier are generally designed to cope with a wide span of input stimuli and the complete complex plane of load impedances. Furthermore, amplifiers need to comply with extreme test bench situations. We can define two rather distinct states:

| State | |
|---|---|
| Normal | Speaker loads |
| | Music stimuli |
| Test | Square, impulse response |
| | Complex loads, open, capacitive,. |
| | Overload/recovery stimuli |

It is quite challenging to design one control system performing optimal in both states. In general, compromises needs to be taken between performance and stability, resulting in that the amplifier actually will not perform optimal in any of the two states, but deliver compromised performance in the both states.

Figure 16:
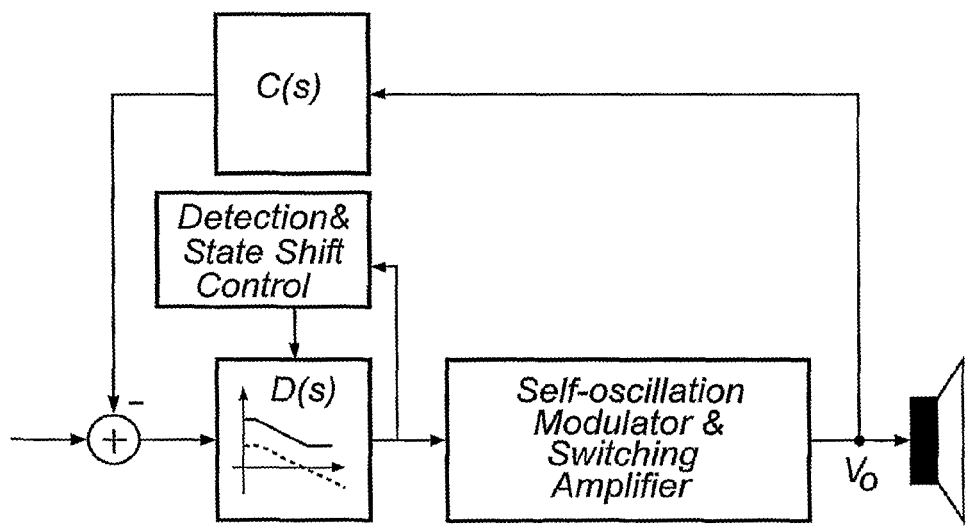
FIG. 16 illustrates an invention concerning load adaptive control in general switching amplifier systems.

FIG. 16 illustrates an invention new to the art, in terms of a Load Adaptive Control (LAC) method, enabling shift between two or more loop transfer functions optimized to each state of operation. The load adaptive control method is general, and may be applied to any switching amplifier, however preferably of the self-oscillation type.

Preferably the LAC has two distinct states and two related loop transfer functions, LS1(s) and LS(2). The obvious advantages is that adaptive feedback loop can now be optimized two the outlined two distinct real world states, enhancing both performance and robust stability in both states, as opposed to the compromise design by prior art.

State detection can be realized by load detection means, output current/voltage detection means, input signal detection means, analog or digital or alternatives. In one preferred method is to detect state by measuring the forward path loop compensator D(s) voltage as illustrated in FIG. 15. The self-oscillation amplifier may for example HCOM in the embodiment shown in FIG. 13, where load adaptive control can advantageously be realized in the $3^{rd}$ loop comprising the basic HCOM amplifier with an additional C(s) feedback path and D(s) forward path to enable enhanced filter and system transfer function control.

Given that LS1(s) is optimized to the normal state only, loop gain bandwidth can be extended significantly, up to 10-15 dB in state 1, compared to conventional compromise loop transfer function designs. When entering state 2, the D(s) block compensator will potentially initiate saturation since LS1(s) is not robust stable in state 2. As soon as an out of nominal range voltage is detected, D(s) is set to state 2, generally a much lower gain and bandwidth compensator mode. After a timeout period, the compensator is reset to state 1, and henceforth the resulting load adaptive control system will always adapt to the actual state.

The invention claimed is:

1. A self-oscillating amplifier system, comprising:
a pulse modulator to modulate an input signal to form a pulse modulated signal;
a switching power amplification stage to amplify the pulse modulated signal;
a passive filter to demodulate a switching output signal;
a first feedback path applied from a switching stage output;
a second feedback path applied from the filter output;
means for forming an error signal by subtracting signals from said first and second feedback paths from the input signal; and
a forward path connecting said means for forming an error signal to said pulse modulator, thereby forming a closed loop, said first and second feedback paths and said forward path having transfer functions so as to ensure self-oscillating conditions of said closed loop,
wherein self-oscillation occurs at an oscillation frequency, at which a total phase lad of the first feedback path, the second feedback path, the forward path and any propagation delay is 180 degrees.

2. The self-oscillating amplifier system according to claim 1, wherein a DC feedback gain of the first feedback path KA1 and second feedback path KA2 is weighted by a weighting factor β, wherein KA1=βKA2.

3. The self-oscillating amplifier system according to claim 2, wherein β<<1, in order to enhance loop gain and bandwidth from the second feedback path, thereby reducing filter related distortion and transfer function filter Q sensitivity.

4. The self-oscillating amplifier system according to claim 1, wherein the first feedback path has at least one of low pass and integrating characteristics.

5. The self-oscillating amplifier system according to claim 1, wherein the first feedback path has a low pass characteristic and the second feedback path has a phase lead characteristic.

6. The self-oscillating amplifier system according to claim 1, wherein a forward path compensation block has a lag characteristic, in order to enhance system loop gain bandwidth within an audio band and enable a well conditioned modulation signal.

7. The self-oscillating amplifier system according to claim 1, wherein the forward path comprises a compensation block with a transfer function B(s).

8. The self-oscillating amplifier system according to claim 1, wherein pulse modulation is enabled by utilizing a non-hysteresis comparator.

9. The self-oscillating amplifier system according to claim 3, wherein the filter natural frequency fn and filter Q are utilized to enhance overall loop gain bandwidth fb contributions from the second feedback path, by fb<fn<2fb and implementation of a resonant filter Q>=1 in the nominal load.

10. The self-oscillating amplifier system according to claim 1, wherein additional loop compensation is applied by a third feedback from the filter output through a separate feedback path, said feedback signal subtracted from an input node and feed to an additional preamplifier stage to form a compensated input signal.

11. The self-oscillating amplifier system according to the claim 10, wherein a feedback path block is identical to the second feedback path.

12. The self-oscillating amplifier system according to claim 1, further comprising means for adaptively switching between at least two loop transfer functions in at least one of one, more and all loops, dependent upon input stimuli and load characteristics.

13. The self-oscillating amplifier system according to claim 12, wherein said means for adaptively switching comprises a filter block in said forward path, said filter block being arranged to be switchable between two states with different filter functions, dependent upon the input stimuli and load characteristics.

14. The self-oscillating amplifier system according to claim 13, wherein said state switching is determined by an output voltage of said forward path filter block.

15. The self-oscillating amplifier system according to claim 2, wherein the first feedback path has at least one of low pass and integrating characteristics.

16. The self-oscillating amplifier system according to claim 1, wherein the first feedback path has at least one pole.

\* \* \* \* \*